United States Patent
Schauwecker et al.

(10) Patent No.: US 6,670,878 B2
(45) Date of Patent: Dec. 30, 2003

(54) MAGNET ARRANGEMENT COMPRISING A SUPERCONDUCTING MAGNET COIL SYSTEM AND A MAGNETIC FIELD FORMING DEVICE AND A DIMENSIONING METHOD

(75) Inventors: Robert Schauwecker, Zurich (CH); Pierre-Alain Bovier, Zurich (CH); Daniel Eckert, Duebendorf (CH); Frank Laukien, Lincoln, MA (US)

(73) Assignee: Bruker Biospin AG, Faellanden (CH)

( * ) Notice: Subject to any disclaimer, the term of this patent is extended or adjusted under 35 U.S.C. 154(b) by 215 days.

(21) Appl. No.: 09/953,313

(22) Filed: Sep. 17, 2001

(65) Prior Publication Data

US 2002/0057155 A1 May 16, 2002

(30) Foreign Application Priority Data

Sep. 19, 2000 (DE) .......................... 100 46 182

(51) Int. Cl.⁷ .................................. H01F 5/00
(52) U.S. Cl. ................. 335/299; 335/216; 600/410; 324/318
(58) Field of Search ................ 335/216, 299; 324/318–320; 505/879; 600/421, 422, 410

(56) References Cited

U.S. PATENT DOCUMENTS

| | | | |
|---|---|---|---|
| 4,587,504 A | | 5/1986 | Brown |
| 4,717,878 A | * | 1/1988 | Taicher et al. ............... 324/303 |
| 4,721,914 A | * | 1/1988 | Fukushima et al. .......... 324/320 |
| 5,012,217 A | | 4/1991 | Palkovich |
| 5,382,904 A | * | 1/1995 | Pissanetzky ................ 324/319 |
| 5,677,630 A | * | 10/1997 | Laskaris et al. ............. 324/320 |
| 5,744,960 A | * | 4/1998 | Pulyer ........................ 324/320 |
| 5,900,793 A | * | 5/1999 | Katznelson et al. ........ 335/296 |
| 6,369,464 B1 | * | 4/2002 | Schauwecker et al. ........ 307/91 |
| 6,476,700 B2 | * | 11/2002 | Schauwecker et al. ...... 335/216 |
| 6,489,872 B1 | * | 12/2002 | Fukushima et al. ......... 335/299 |
| 6,496,091 B2 | * | 12/2002 | Schauwecker et al. ...... 335/216 |
| 6,563,316 B2 | * | 5/2003 | Schauwecker et al. ...... 324/318 |
| 2002/0097051 A1 | * | 7/2002 | Miller et al. ................. 324/318 |

* cited by examiner

Primary Examiner—Lincoln Donovan
Assistant Examiner—Bernard Rojas
(74) Attorney, Agent, or Firm—Paul Vincent (57) ABSTRACT

A magnet arrangement comprising a superconducting magnet coil system (M) for producing a magnetic field in the direction of a z axis in a working volume (AV) disposed on the z axis about z=0, wherein the superconducting magnet coil system (M) comprises a radially inner partial coil system (C1) and a radially outer partial coil system (C2) which is coaxial thereto, and with a field forming device (P) of magnetic material disposed in a preferably cylindrically symmetrical fashion about the z axis, located radially between the radially inner and the radially outer partial coil system (C1, C2), and being coaxial with respect to the two partial coil systems (C1, C2), wherein the radially inner partial coil system (C1) produces a homogeneous field in the working volume (AV) and the radially outer partial coil system (C2) produces an inhomogeneous field in the working volume (AV) is characterized in that the radially outer partial coil system (C2) produces, together with the magnetic field forming device (P), a homogeneous field in the working volume (AV), wherein the magnetic material of the field forming device (P) is largely magnetically saturated with its magnetization pointing substantially in a direction along the z axis. In this fashion, a homogenized radially inner partial coil system (C1) can be supplemented with an inhomogeneous radially outer partial coil system (C2), such that, through the use of a magnetic field forming device (P), the overall resulting magnet arrangement once more produces a homogeneous magnetic field in the working volume of the magnet arrangement.

19 Claims, 3 Drawing Sheets

MAGNET ARRANGEMENT COMPRISING A SUPERCONDUCTING MAGNET COIL SYSTEM AND A MAGNETIC FIELD FORMING DEVICE AND A DIMENSIONING METHOD

This application claims Paris Convention priority of DE 100 46 182.4 filed on Sep. 19th, 2000 the entire disclosure of which is hereby incorporated by reference.

BACKGROUND OF THE INVENTION

The invention concerns a magnet arrangement comprising a superconducting magnet coil system for generating a magnetic field in the direction of a z axis in a working volume disposed on the z axis about z=0, wherein the superconducting magnet coil system comprises a radially inner partial coil system and a radially outer partial coil system which is coaxial thereto, and a field forming device of magnetic material which is disposed about the z axis and preferably cylindrically symmetrical thereto, and is located radially between the radially inner and the radially outer partial coil system and is coaxial with the two partial coil systems, wherein the radially inner partial coil system produces a homogeneous field in the working volume while the radially outer partial coil system per se produces an inhomogeneous field in the working volume. The invention also concerns various methods for dimensioning the magnetic field forming device.

U.S. Pat. No. 4,587,504 (Re. 36,782) discloses a superconducting magnet arrangement with a radially inner and a radially outer partial coil system and a magnetic shielding, wherein the magnetic field of the radially inner partial coil system is homogeneous.

U.S. Pat. No. 5,012,217 discloses a superconducting magnet arrangement comprising a radially inner and a radially outer partial coil system with a cylindrically symmetrical shielding disposed radially between the two partial coil systems, wherein the magnetic field of the radially outer partial coil system is inhomogeneous.

Superconducting magnet coil systems are used for different applications, in particular for magnetic resonance methods, wherein the local homogeneity of the magnetic field in the working volume of the magnet arrangement is usually important. The most demanding applications involve high-resolution nuclear magnetic resonance spectroscopy (NMR spectroscopy). One typically tries to obtain a magnetic field strength which varies by less than 10 ppm of the field strength in the working volume through a length of between 50 to 60 mm along the axis of the magnet coil system. Means for homogenizing the field of the magnet coil system increase the coil volume. In consequence thereof and due to the typically very large field strengths, coil systems for magnetic resonance applications have a large magnetic dipole moment and therefore produce a large stray field. To counteract this stray field, superconducting partial coil systems can be mounted which compensate for the dipole moment of the main coil system (actively shielded magnet coil system). Additional stray field reduction can be achieved with magnetic shielding. These measures for reducing stray fields must not impair the field homogeneity in the working volume of the magnet arrangement.

U.S. Pat. No. 4,587,504 (Re. 36,782) describes an actively shielded magnet coil system for nuclear magnetic resonance applications wherein the field homogeneity in the working volume is obtained either by individually homogenizing both the main coil system and the shielding coil system or in that both partial coil systems mutually compensate each others inhomogeneous field contributions. The first embodiment is directed towards improving control of the resulting field homogeneity in the working volume while the second embodiment permits construction of a more compact magnet coil system. Additional magnetic shielding optimizes stray field suppression without influencing the field homogeneity in the working volume.

U.S. Pat. No. 5,012,217 describes an actively shielded superconducting magnet arrangement with additional magnetic shielding, wherein the magnetic field in the working volume generated by the magnet coil system itself is inhomogeneous and is rendered homogeneous through the field contribution of the magnetic shielding. More compact magnet systems can be constructed through utilization of the magnetic shielding for field homogenization. The field inhomogeneity of the magnet coil system is typically produced by the main coil system and also by the shielding coil system. The magnetic shielding is partially located radially between the two partial coil systems to permit reduction in the ampere winding number of the shielding coil system with respect to other conventional magnetic shielding arrangements.

Magnetic shielding in actively shielded magnet arrangements according to prior art is used to improve the stray field suppression of the actively shielded magnet arrangement thereby facilitating the field homogenization in the working volume.

In contrast thereto, it is the object of the present invention to supplement a homogeneous but not actively shielded magnet coil system (referred to as the radially inner partial coil system below) with an inhomogeneous radially outer partial coil system such that the overall resulting magnet arrangement produces, together with a magnetic field forming device, a homogeneous magnetic field in the working volume of the magnet arrangement. The radially outer partial coil system provides e.g. active stray field compensation.

SUMMARY OF THE INVENTION

In accordance with the invention, this object is achieved in that the radially outer partial coil system produces, together with the magnetic field forming device, a homogeneous field in the working volume. To utilize the magnetic field forming device for homogenizing the radially outer partial coil system, its exact field profile in the working volume must be calculated. Towards this end, it is particularly important that no magnetic hysteresis or remanence effects occur and that simple and exact calculation algorithms can be applied for the shape of the field of the magnetic field forming device in the working volume.

The invention solves this partial problem in that the radially inner and outer partial coil systems are designed such that there is a region in the radial space between the two partial coil systems where the magnetic field largely extends in a direction along the axis of the magnet arrangement and its strength is sufficient to magnetically saturate the magnetic material used, wherein the magnetic field forming device is disposed in this region.

Since the magnetic field forming device with the radially outer partial coil system of an inventive arrangement produce a homogeneous magnetic field in the working volume, existing radially inner partial coil systems can be advantageously retrofitted with a radially outer partial coil system and magnetic field forming device. Additionally, a magnet system can be produced in two variants: one with and one without radially outer partial coil system and magnetic field forming device. Magnet arrangements can be manufactured e.g. with or without stray field compensation using the same radially inner partial coil system. Homogenization of the radially outer partial coil system with the magnetic field forming device has the advantage that the radially outer partial coil system can have a simple structure; typically one single solenoid coil. The magnetic saturation of the magnetic field forming device and orientation of its magnetization along the axis of the magnet arrangement as well as the cylindrical symmetry of the magnetic field forming device permit simulation of its magnetic field as fields from cylinder surface currents, thereby permitting simple and precise calculation of the field.

In one particularly preferred embodiment of the inventive magnet arrangement, the radially inner and outer partial coil systems are electrically connected in series and form one single current path which is bridged via a switch. Such a magnet arrangement guarantees, without any further measures, that currents of identical magnitude flow in both partial coil systems.

In another advantageous embodiment of the inventive magnet arrangement, the radially inner and outer partial coil systems are electrically separated to constitute two separate current paths, each of which is bridged with a superconducting switch. The current in the individual partial coil systems of such a magnet arrangement can be changed individually.

In two further developments of this embodiment, either the radially outer partial coil system is inductively charged by the radially inner partial coil system during operation, or the radially inner partial coil system and the radially outer partial coil system can be charged with currents of the same or opposite polarity. In the first further development, the radially outer partial coil system can advantageously form a closed superconducting circuit. The second further development is advantageous since, in dependence on the individual requirements of the magnet arrangement user, the radially outer coil system can thereby be used to reduce the stray field of the magnet arrangement or to increase the field in the working volume, if the field contribution of the radially outer partial coil system at the location of the magnetic field forming device dominates over that of the radially inner partial coil system.

A particularly preferred embodiment of the inventive magnet arrangement is characterized in that the two partial coil systems each produce one magnetic field of opposite direction along the axis of the magnet arrangement in the working volume. This arrangement reduces the stray field of the radially inner partial coil system. The inventive use of a magnetic, preferably a ferromagnetic, field forming device disposed radially between the two partial coil systems of this arrangement has the particular advantage that the radially inner partial coil system is shielded towards the outside, i.e. the stray field is reduced. Moreover, the radially outer partial coil system is shielded from the working volume of the magnet arrangement, i.e. the field in the working volume is reduced to a lesser extent by the radially outer coil system. This saves superconducting wire in the radially outer partial coil system and the current in the radially inner partial coil system must be increased to a lesser extent to maintain the field strength in the working volume.

A preferred further development of the above embodiment provides that the radially inner partial coil system has a magnetic dipole moment which is approximately equal in value and opposite in sign to that of the radially outer partial coil system with the magnetic field forming device. If this condition is met, the two field contributions outside of the magnet arrangement largely cancel and nearly ideal compensation of the stray field of the magnet arrangement is effected.

In one advantageous further embodiment of the inventive magnet arrangement, the magnetic field forming device consists of a ring of axial length LP having an inner radius RiP, wherein LP is approximately equal to RiP. This embodiment of the magnetic field forming device permits maximum efficiency for compensation of field inhomogeneities of the radially outer partial coil system having a quadratic spatial dependence along the axis of the magnet arrangement, i.e. a minimum amount of magnetic material will be used.

In a further preferred embodiment of the inventive magnet arrangement, the magnetic field forming device consists of two rings of axial length LQ and with an inner radius RiP which are disposed symmetrically at a separation DQ from the central plane of the magnet arrangement, wherein DQ<0.5·RiP and (DQ+2 LQ) are approximately equal to RiP. In this embodiment of the magnetic field forming device, the field inhomogeneities of the radially outer partial coil system which have a quadratic spatial dependence along the axis of the magnet arrangement can be efficiently compensated. In addition, a field contribution having a spatial dependence along the axis of the magnet arrangement which is higher than quadratic, can also be compensated.

A particularly preferred embodiment of the inventive magnet arrangement is characterized in that the radially outer partial coil system consists of a solenoid coil of axial length LC2 and having an inner radius of RiC2, wherein LC2 is approximately greater than or equal to twice the inner radius RiC2. In such an arrangement, the region in which the magnetic field largely extends along the axis of the magnet arrangement and has a strength which is sufficient to magnetically saturate the magnetic material used, is generally particularly large. It is particularly advantageous for manufacturing reasons, to design the radially outer coil system as a solenoid coil. In this embodiment, homogenization of the radially outer coil system by the magnetic field forming device is particularly advantageous since complicated homogenizing structures in the coil system can be omitted.

The magnet arrangement of a further embodiment is characterized in that it is part of an apparatus for high-resolution magnetic resonance spectroscopy. The homogeneity requirements for the field in the working volume are particularly high for such a magnet arrangement and the fact that, in an inventive magnet arrangement, the field contribution of the magnetic field forming device in the working volume can be calculated with the same accuracy as that of the coil systems is of particular advantage.

The present invention also comprises two methods for compensating field inhomogeneities, e.g. due to production tolerances, having a quadratic spatial dependence along the axis of the magnet arrangement (referred to below as an H2 inhomogeneity). With these methods a device for correcting such inhomogeneities (a so-called "$Z^2$ shim") can be advantageously omitted. In the first method, the current in the radially outer partial coil system is suitably varied and the stray field of the magnet arrangement is largely kept constant by changing the current in the radially inner partial coil system in the same manner, wherein the radially outer partial coil system C2 is preferably an active shielding. In the second method, the current in the radially outer partial coil system is suitably varied and the field in the working volume of the magnet arrangement is kept largely constant by suitably changing the current in the radially inner partial coil system. The methods are based on the fact that the radially inner partial coil system has, in accordance with the invention, a negligibly small H2 inhomogeneity whereas the radially outer partial coil system has a large H2 inhomogeneity which is largely compensated for by the magnetic field forming device. The H2 inhomogeneity of the radially outer partial coil system varies with the current whereas that of the magnetic field forming device remains constant due to the magnetic saturation. A variation of the current in the radially outer partial coil system thereby produces a small H2 inhomogeneity whereas current adjustments in the radially inner partial coil system have no further influence on the H2 inhomogeneity.

The present invention also comprises a method for homogenizing the radially outer partial coil system using a magnetically saturated magnetic field forming device which is magnetized in a direction along the axis z of the magnet arrangement and which is cylindrically symmetrical with respect to this axis, wherein the field inhomogeneities $H_n(C2)$ of the radially outer partial coil system, which have a spatial dependence of an nth power along the axis z of the magnet arrangement, are compensated for n=1, 2, 3 and 4 by corresponding field inhomogeneities $H_n(P)=-H_n(C2)$ of the magnetic field forming device, wherein the field inhomogeneities $H_n(P)$ are calculated by assuming a cylindrical surface current $J_S$ on each radially inner and each radially outer surface $S=SI_k$ and $S=SA_m$ of the magnetic field forming device, whose contribution $H_n(S)$ to the field inhomogeneity $H_n(P)$ is $$H_n(S)\left[\frac{T}{m^n}\right] = \frac{\mu_0 \cdot J_S}{R_S^n}\left(Y_n\left(\frac{z1_S}{R_S}\right) - Y_n\left(\frac{z2_S}{R_S}\right)\right)$$

with $$J_S\left[\frac{A}{m}\right] = \begin{cases} -\text{sign}(M_z) \cdot \frac{M_{Sat}}{\mu_0} f\ddot{u}rS = SI_k \\ \text{sign}(M_z) \cdot \frac{M_{Sat}}{\mu_0} f\ddot{u}rS = SA_m \end{cases}$$

$$\mu_0 = 4\pi \cdot 10^{-7}\left[\frac{Vs}{Am}\right]$$

sign($M_z$): Sign of the axial magnetization of the material of the magnetic field forming device, $M_{Sat}$[T]: Saturation magnetization of the material of the magnetic field forming device, $R_S$[m]: Radius of the cylindrical surface S, $z1_S$[m]: Separation of the lower edge of the cylinder surface S from z=0, $z2_S$[m]: Separation of the upper edge of the cylinder surface S from z=0, $$Y_1(x) = \frac{1}{2(x^2+1)^{3/2}},$$

$$Y_2(x) = \frac{3x}{4(x^2+1)^{5/2}},$$

$$Y_3(x) = \frac{(4x^2-1)}{4(x^2+1)^{7/2}},$$

$$Y_4(x) = \frac{5x(4x^2-3)}{16(x^2+1)^{9/2}},$$

and through adding the contributions $H_n(S)$ of all surface currents $J_S$. With this method, the field inhomogeneities $H_n(P)$ of the magnetic field forming device can advantageously be precisely calculated.

The invention also comprises a method for calculating the field contribution $H_0(P)$, in the working volume at z=0, of a magnetically saturated magnetic field forming device, which is magnetized in a direction along the axis z of the magnet arrangement and which is cylindrically symmetrical with respect to this axis, characterized in that a cylindrical surface current $J_S$ is assumed on each radially inner and each radially outer surface $S=SI_k$ and $S=SA_m$ of the magnetic field forming device, whose contribution $H_0(S)$ to $H_0(P)$ is $$H_0(S)[T] = \mu_0 \cdot J_S \cdot \left(Y_0\left(\frac{z1_S}{R_S}\right) - Y_0\left(\frac{z2_S}{R_S}\right)\right) \text{ with}$$

$$J_S\left[\frac{A}{m}\right] = \begin{cases} -\text{sign}(M_z) \cdot \frac{M_{Sat}}{\mu_0} f\ddot{u}rS = SI_k \\ \text{sign}(M_z) \cdot \frac{M_{Sat}}{\mu_0} f\ddot{u}rS = SA_m \end{cases}$$

and with $Y_0(x) = -\frac{x}{2(x^2+1)^{1/2}}$, with the contributions $H_0(S)$ of all surface currents $J_S$ being added, wherein the variables have the above-mentioned definitions. With this method, the field contribution $H_0(P)$ of the magnetic field forming device in the working volume can advantageously be precisely calculated.

The present invention also concerns a method for calculating the magnetic dipole moment m(P) of a magnetically saturated magnetic field forming device which is magnetized in a direction along the z axis of the magnet arrangement and which is cylindrically symmetrical to said axis, characterized in that the variable $$m(P)\left[\frac{A}{m^2}\right] = \frac{M_{Sat}}{\mu_0} \cdot V_P \cdot \text{sign}(M_z)$$

is calculated with $V_P$[m³]: Volume of the magnetic field forming device.

The other variables have the definitions given above. With this method, the dipole moment of the magnetic field forming device and therefore its contribution to the stray field of the magnet arrangement can advantageously be precisely calculated.

Further advantages of the invention can be extracted from the description and the drawing. The features mentioned above and below can be used individually or collectively in any arbitrary combination. The embodiments shown and described are not to be understood as exhaustive enumeration but rather have exemplary character for describing the invention.

The invention is shown in the drawing and explained in more detail with reference to embodiments.

DESCRIPTION OF THE PREFERRED EMBODIMENT

Figure 1:
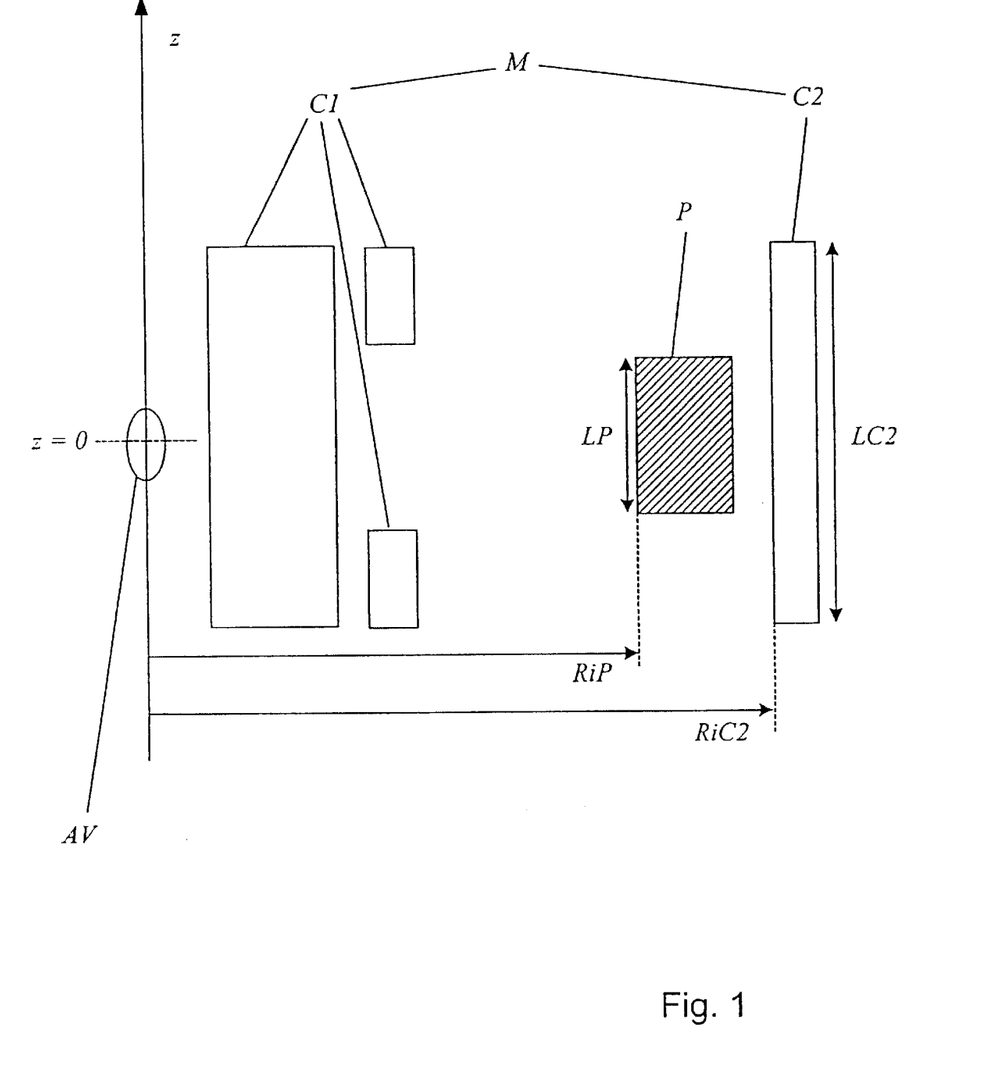
FIG. 1 shows a schematic vertical section through a radial half of the inventive magnet arrangement.

FIG. 1 shows an inventive magnet arrangement which is disposed about a working volume AV and comprises a magnet coil system M having a radially inner and a radially outer coaxial coil system C1 and C2 and a magnetic field forming device P in the form of a ring. LP and LC2 refer to the axial length of the field forming device P and of the radially outer coil system C2. RiP and RiC2 designate the inner radius of the field forming device P and of the radially outer coil system C2.

Figure 2:
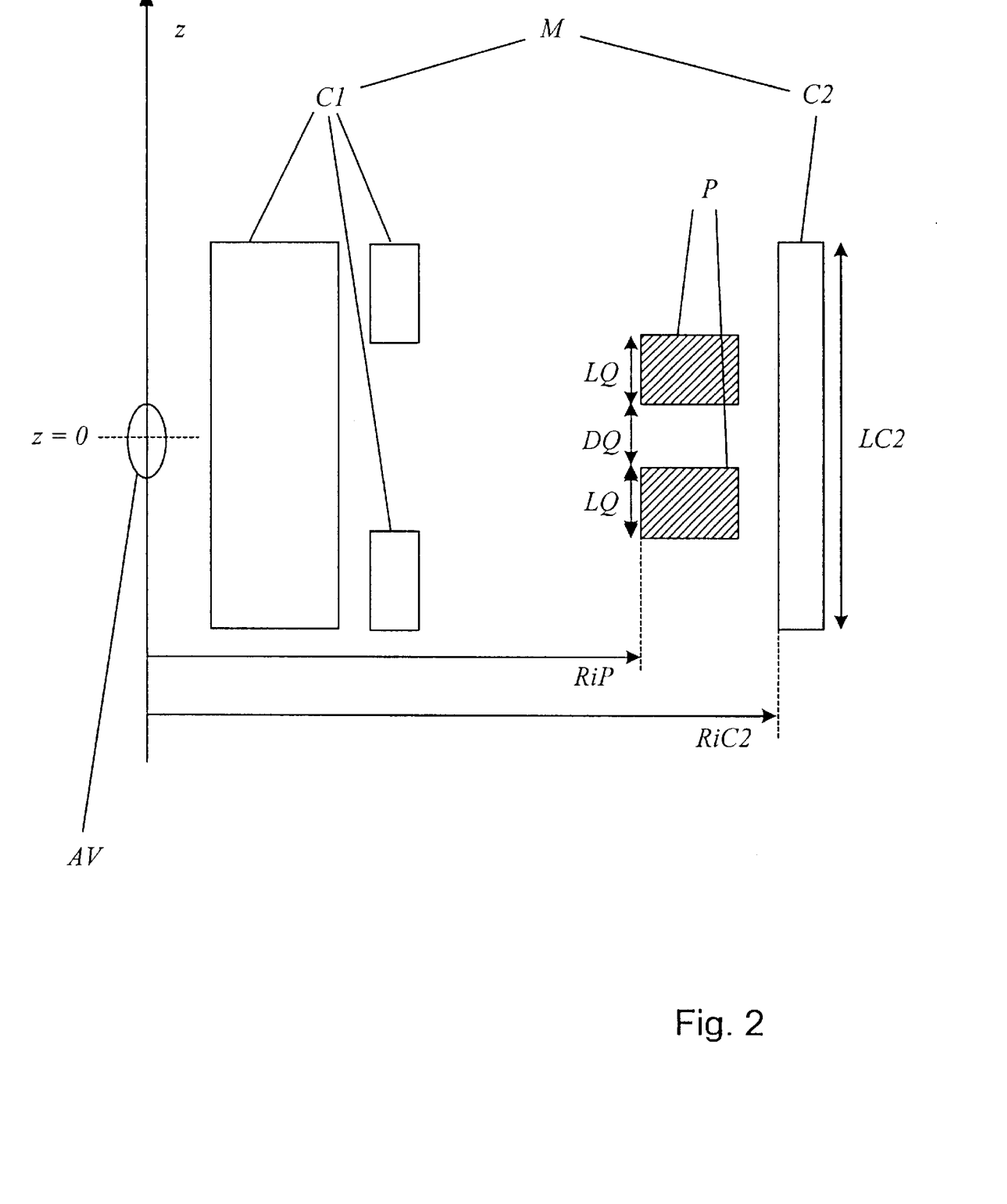
FIG. 2 shows a schematic vertical section through a radial half of the inventive magnet arrangement with a particularly preferred embodiment of the magnetic field forming device P.

FIG. 2 shows a particularly preferred embodiment of the magnetic field forming device P which comprises two rings centered about z=0 at a separation DQ. LQ and LC2 designate the axial length of the field forming device rings and of the radially outer coil system C2. RiP and RiC2 designate the inner radius of the field forming device rings and of the radially outer coil system C2.

Figure 3:
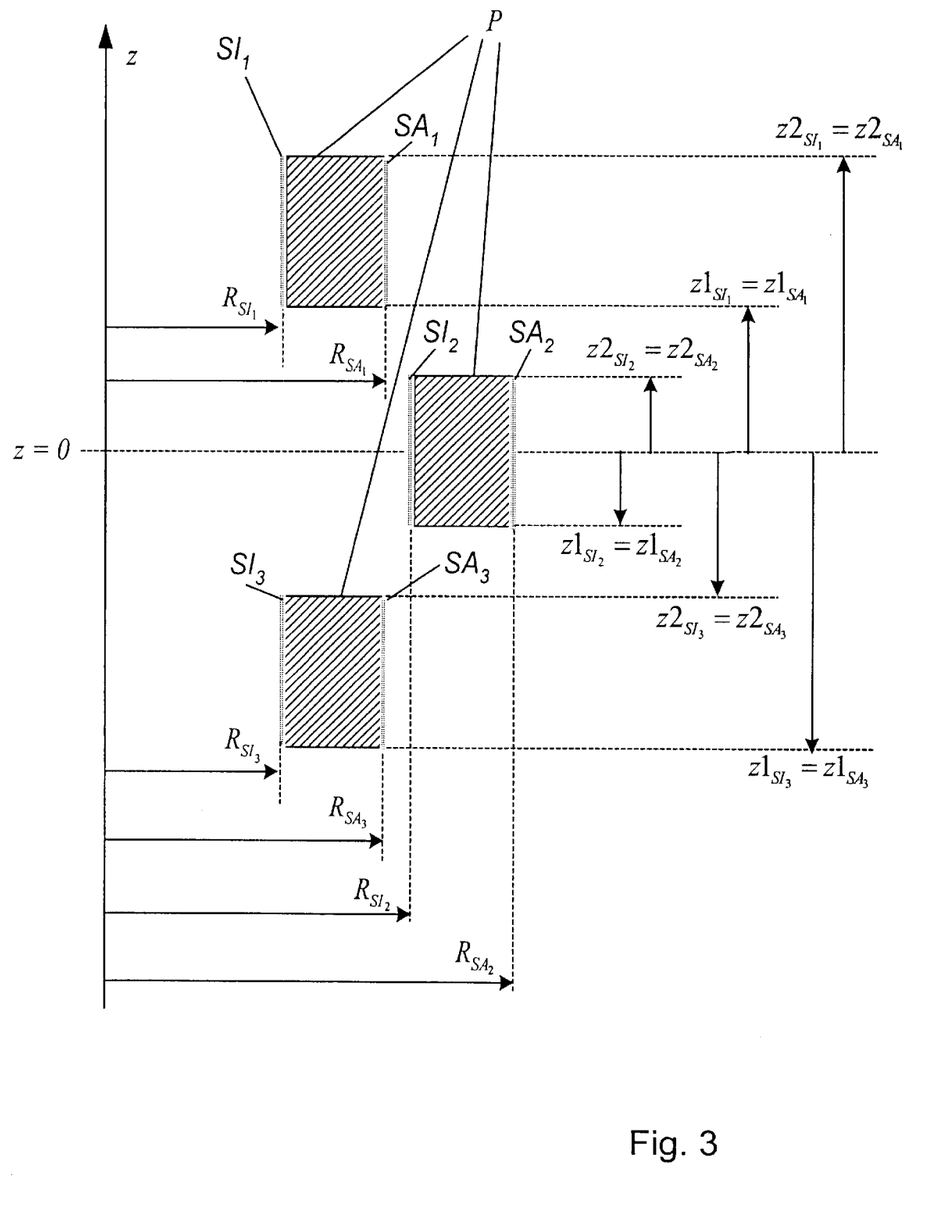
FIG. 3 shows a schematic vertical section through a radial half of an inventive magnetic field forming device P in the form of several concentric rings.

FIG. 3 shows a magnetic field forming device P in the form of several concentric rings comprising radially inner and radially outer cylindrical surfaces $SI_1$, $SI_2$, $SI_3$ and $SA_1$, $SA_2$, $SA_3$. The variables $R_{SI_k}$ and $R_{SA_k}$ (k=1, 2, 3) characterize the radii of the cylindrical surfaces. The variables $z1_{SI_k} = z1_{SA_k}$, (k=1, 2, 3) designate the separation of the lower edge of the cylindrical surface $SI_k$ and $SA_k$ from z=0. The variables $z2_{SI_k} = z2_{SA_k}$ (k=1, 2, 3) designate the separation of the upper edge of the cylindrical surface $SI_k$ and $SA_k$ from z=0.

The invention is explained below with reference to different embodiments of a superconducting magnet arrangement which each produce a magnetic field of 9.40 Tesla in the working volume AV. This field strength is often used in nuclear magnetic resonance apparatus. It corresponds to a proton resonance frequency of 400 MHz. Niobium titanium is used as superconducting material. The magnet is operated in a liquid helium bath at a temperature of 4.2 Kelvin.

A typical embodiment (referred to as embodiment "A1" below) of such a magnet arrangement comprises a magnet coil system M with several concentric coaxial solenoid coils of identical polarity, wherein the coils are structured and configured such that the field profile of the magnet arrangement in the working volume AV meets the homogeneity requirements for nuclear magnetic resonance applications. The embodiment A1 is therefore a magnet coil system without devices for compensating the stray field. The free inner bore has a diameter of 70 millimeters.

To reduce the stray field of this magnet arrangement, an oppositely polarized additional partial coil system can be mounted radially outside of the original coil system and be electrically connected in series thereto. The original radially inner partial coil system is called "main coil C1" and the radially outer is called "active shielding C2" below. This embodiment is called "A2" below.

An inventive variant (called "A3" below) is compared with variant A2. The variant A3 comprises, in addition to active shielding C2 a magnetically saturated magnetic field forming device P which is magnetized in a direction along the magnet axis. The magnetic field forming device P is used for homogenizing the active shielding C2.

Table 1 compares the most important features of embodiments A1, A2 and A3.

TABLE 1

|  | A1 | A2 | A3 |
|---|---|---|---|
| B [Tesla] | 9.40 | 9.40 | 9.40 |
| I [Ampere] | 98.0 | 107.7 | 105.7 |
| L [Henry] | 40.6 | 37.0 | 35.6 |
| E [Kilojoules] | 195 | 215 | 199 |

TABLE 1-continued

|  | A1 | A2 | A3 |
|---|---|---|---|
| Z10 [Millimeters] | 56 | 56 | 56 |
| R5G [Meters] | 2.27 | 0.79 | 0.77 |
| LWC2 [Meters] | — | 6088 | 4719 |

In Table 1
 B is the magnetic field strength in the working volume AV,
 I is the current in the overall magnet coil system,
 L is the inductance of the overall magnet coil system,
 E is the field energy of the overall magnet coil system,
 Z10 is the length of the region along the magnet axis where the field strength differs by less than 10 ppm from the maximum value,
 R5G is the distance from the magnet axis at which the stray field of the magnet arrangement is below 0.5 millitesla at the central magnet plane,
 LWC2 is the length of the superconductor wire wound in the active shielding.

To permit a comparison among the three embodiments A1, A2 and A3 their magnetic field in the working volume and the field homogeneities were equal. The effect of the device for stray field compensation in the embodiments A2 and A3 is seen in the reduction of the distance from the magnet axis at which the stray field is less than 0.5 millitesla, to approximately a third of the original value. The two shielded magnet arrangements therefore require only approximately 10 percent of the laboratory space used by the unshielded magnet arrangement. A comparison of variant A2 to the inventive variant A3 shows that—with identical stray field compensation—use of the magnetic field forming device permits considerable reduction in the amount of wire in the active shielding C2 as well as a reduction in the current increase compared to the unshielded arrangement A1. The gain is between 20 and 25 percent compared to variant A2. The magnetic field forming device has a particularly advantageous effect on the field energy in the magnet coil system which increases by only 2 percent in the embodiment A3 compared to the field energy of embodiment A1, instead of 10 percent as in variant A2.

Since, in all three embodiments A1, A2 and A3, the main coil C1 produces a homogeneous field in the working volume, the stray field shielding, which consists of active shielding C2 for A2 and the active shielding C2 and the magnetic field forming device P in A3, must also produce an overall homogeneous field such that the resulting field of the entire arrangement is also homogeneous. This is achieved in variant A2 in that the active shielding C2 comprises three coaxial solenoid coils. Suitable selection of the length and the axial positions of the solenoid coils permits generation of the required field homogeneity in the working volume.

The active shielding C2 of the inventive magnet arrangement A3 consists, however, of one individual solenoid having an inner radius of 0.2 meter and an axial length of 0.4 meter, which is disposed symmetrically about the central plane of the magnet arrangement. This embodiment of the active shielding C2 can be realized with considerably less effort than a variant in accordance with embodiment A2. The solenoid comprises 3720 wire windings with a current of 105.7 ampere in each winding.

The spatial dependence of the field strength $B_{C2}$ of this coil along the magnet axis can be described by a polynomial:

$$B_{C2}(z) = H_0(C2) + H_2(C2) \cdot z^2 + H_4(C2) \cdot z^4 + H_6(C2) \cdot z^6 +$$

wherein z is the axial distance from the center of the working volume AV of the magnet arrangement. The contributions of fourth and higher order are sufficiently small for the active shielding C2 of magnet arrangement A3 as to have no effect on the field profile in the working volume AV. This coil substantially produces a magnetic field whose strength has a parabolic dependence along the magnet axis in the field of the working volume AV of the magnet arrangement. Such a field profile is insufficient for a nuclear magnetic resonance apparatus. The terms of second and fourth order must be substantially zero.

The inhomogeneity of the active shielding C2 is compensated for by the magnetic field forming device P in an inventive magnet arrangement. For a magnet arrangement A3 this means that the parabolic field contribution $H_2(C2)$ of the active shielding C2 must be compensated by an equal and opposite contribution $H_2(P)=-H_2(C2)$ from the magnetic field forming device P. $H_2(C2)$ is 0.82 millitesla/cm² for the above-described solenoid coil. This inhomogeneity is compensated for in the embodiment A3 through a magnetic field forming device P in the form of a hollow cylinder which is coaxial with respect to the magnet coil system, wherein the inner radius is 0.148 meter and the outer radius is 0.175 meter and the length is 0.213 meter. The magnetic field forming device P consists of soft iron and is disposed symmetrically about the central plane of the magnet arrangement.

Assuming that the magnetic material is magnetically saturated and magnetized in a direction along the axis of the magnet arrangement, calculation of $H_2(P)$ is possible assuming a cylindrical surface current $J_S$ on the radially inner and the radially outer surface S=SI and S=SA of the magnetic field forming device P whose contribution $H_2(S)$ to $H_2(P)$ is $$H_2(S)\left[\frac{T}{m^2}\right] = \frac{\mu_0 \cdot J_S}{R_S^2}\left(Y_2\left(\frac{z1_S}{R_S}\right) - Y_2\left(\frac{z2_S}{R_S}\right)\right)$$

with $$J_S\left[\frac{A}{m}\right] = \begin{cases} -\text{sign}(M_z) \cdot \frac{M_{Sat}}{\mu_0} \text{ für } S = SI \\ \text{sign}(M_z) \cdot \frac{M_{Sat}}{\mu_0} \text{ für } S = SA \end{cases}$$

$$\mu_0 = 4\pi \cdot 10^{-7}\left[\frac{V \cdot s}{A \cdot m}\right]$$

sign($M_z$): Sign of the axial magnetization of the material of the magnetic field forming device P, $M_{Sat}$[T]: Saturation magnetization of the material of the magnetic field forming device P (2.15 T for soft iron), $R_S$[m]: Radius of the cylindrical surface S, $z1_S$[m]: Distance of the lower edge of the cylinder surface S from the central plane of the magnet arrangement, $z2_S$[m]: Distance of the upper edge of the cylinder surface S from the central plane of the magnet arrangement, $$Y_2(x) = \frac{3x}{4(x^2+1)^{5/2}}.$$

$H_2(P)$ is then the sum of the two contributions $H_2(SI)$ and $H_2(SA)$ of the surface currents $J_{SI}$ and $J_{SA}$. The field contributions $H_n(P)$ for other orders n can be calculated in the same manner. The functions $Y_n(x)$ for n=1, 3 and 4 are e.g.:

$$Y_1(x) = \frac{1}{2(x^2+1)^{3/2}},$$

$$Y_3(x) = \frac{(4x^2-1)}{4(x^2+1)^{7/2}} \text{ and}$$

$$Y_4(x) = \frac{5x(4x^2-3)}{16(x^2+1)^{9/2}}.$$

The field contribution of zero order $H_0(P)$ corresponds to the field strength by which the total field in the center of the working volume AV is changed by the magnetic field forming device P. It is calculated in the same manner using the function:

$$Y_0(x) = -\frac{x}{2(x^2+1)^{1/2}}.$$

To permit application of this method for calculating the field profile of the magnetic field forming device P along the axis of the magnet arrangement, the magnetic material must be magnetically saturated and must be completely magnetized in a direction along the axis of the magnet arrangement. Whether this is the case or not depends on the background field within which the magnetic field forming device is located. This field is generated by the main coil C1 and the active shielding C2. In the inventive magnet arrangement A3, this field is stronger than 1.25 Tesla everywhere in the entire volume of the magnetic field forming device P which is sufficient for largely magnetically saturating the soft iron used. The field component in the direction along the axis of the magnet arrangement is at least approximately ten times stronger than the component pointing radially away from this axis throughout the entire volume of the magnetic field forming device P. For this reason, the material is not only magnetically saturated but also magnetized purely in a direction along the axis of the magnet arrangement. The preconditions for using the above-mentioned method for calculating the field profile of the magnetic field forming device P along the axis of the magnet arrangement can be applied for the inventive magnet arrangement A3.

In an inventive magnet arrangement, e.g. also in embodiment A3, the magnetic field forming device P is mounted radially between the radially inner and outer partial coil systems C1 and C2. This is advantageous in that the superposition of the field contributions of the two partial coils in this region is constructive, if the radially outer partial coil system is an active shielding. This improves the preconditions for magnetic saturation of the magnetic field forming device P. The direction of magnetization is moreover such that the field in the working volume AV is increased by the magnetic field forming device P while the stray field is attenuated.

The active shielding coil C2 in the inventive magnet arrangement A3 was dimensioned such that its axial length is equal to its inner diameter. Coil arrangements with this or larger length-to-radius ratios tend to produce a more axially oriented field radially between the main coil C1 and the active shielding C2 than do coils with a smaller length-to-radius ratio. This improves the preconditions for purely axial magnetization of the magnetic field forming device P. For the same reason, the axial length of the magnetic field forming device P was made substantially shorter than that of the active shielding C2, since the non-axial field components of a magnet coil system become large principally in the region of the coil ends. Magnetic field forming devices P having a length-to-radius ratio of one or smaller, produce the field inhomogeneities $H_n(P)$ for n=2 or 4 in the most effective fashion, i.e. with a minimum of material.

To optimally dimension a magnetic field forming device P, the contributions $H_n(P)$ to the overall field profile must be calculated correctly along the axis of the magnet arrangement in the region of the working volume AV for n=0, 1, 2, . . . Moreover, the contribution to the stray field outside of the magnet arrangement must also be determined. A simple method is based on the calculation of the magnetic dipole moment m(P) of the magnetic field forming device P:

$$m(P)\left[\frac{A}{m^2}\right] = \frac{M_{Sat}}{\mu_0} \cdot V_P \cdot \mathrm{sign}(M_z),$$

with $V_P[m^3]$: Volume of the magnetic field forming device P.

The other variables used have the above-mentioned definitions. At a sufficiently large distance from the magnet arrangement, the field of the magnetic field forming device P can be calculated with the known formulas for the field of a magnetic dipole with magnetic dipole moment m(P).

We claim:

1. A magnetic system comprising a superconducting magnet coil system for generating a magnetic field in a direction of a z axis in a working volume disposed about z=0, the system comprising:

means for generating a first homogeneous field in the working volume using a radially inner partial coil means;

means for generating, per se, an inhomogeneous field in the working volume using a radially outer coil means coaxial to said inner coil means; and means for producing, together with said outer coil means, a second homogeneous field in the working volume using a field forming device of magnetic material disposed radially between said inner and said outer coil means and coaxial with respect to said inner coil means and said outer coil means, wherein said magnetic material of said field forming device is substantially magnetically saturated, and a magnetization of said field forming device points substantially parallel or anti-parallel to the z axis.

2. The magnetic system of claim 1, wherein said field forming device is disposed cylindrically symmetrically about the z axis.

3. The magnetic system of claim 1, wherein said inner coil means and said outer coil means are electrically connected in series to form one single current path, and further comprising a superconducting switch bridging said one single current path.

4. The magnetic system of claim 1, wherein said inner coil means and said outer coil means are electrically separated to form a first and a second separate current path, and further comprising a first superconducting switch bridging said first separate current path and a second superconducting switch bridging said second separate current path.

5. The magnetic system of claim 4, wherein, during operation, said outer coil means is inductively charged by said inner coil means.

6. The magnetic system of claim 4, wherein said inner partial coil means and said outer coil means can be charged with currents having one of equal and opposite polarity.

7. The magnetic system of claim 1, wherein each of said inner partial coil means and said outer coil means produces a magnetic field in the working volume of opposite direction along the z axis.

8. The magnetic system of claim 7, wherein said inner coil means has a magnetic dipole moment which is approximately equal in value and opposite in sign to that of said outer coil means together with said field forming device.

9. The magnetic system of claim 1, wherein said field forming device consists essentially of a ring of axial length LP having an inner radius RiP, wherein LP Is approximately equal to RiP.

10. At The magnetic system of claim 9, wherein said outer coil means consists essentially of a solenoid coil of axial length LC2 having an inner radius of RiC2, wherein LC2 is approximately equal to twice the inner radius RiC2 or greater.

11. The magnetic system of claim 1, wherein said field forming device consists essentially of two rings of axial length LQ having an inner radius RiP, which are disposed symmetrically about z=0 at a separation DQ, wherein DQ<0.5 RiP and (DQ+2 LQ) is approximately equal to RiP.

12. The magnetic system of claim y wherein said outer coil means consists essentially of a solenoid coil of axial length LC2 having an inner radius of RiC2, wherein LC2 is approximately equal to twice the inner radius RiC2 or greater.

13. The magnet system of claim 1, further comprising means for high-resolution magnetic resonance spectroscopy.

14. A method for generating a magnetic field in a direction of a z axis in a working volume disposed about z=0 using a magnetic system comprising a superconducting magnet coil system, the method comprising the steps of:

a) generating a first homogeneous field in the working volume using a radially inner partial coil means;

b) generating, per se, an inhomogeneous field in the working volume using a radially outer coil means coaxial to said inner coil means; and c) producing, together with said outer coil means, a second homogeneous field in the working volume using a field forming device of magnetic material disposed radially between said inner and said outer coil means and coaxial with respect to said inner coil means and said outer coil means, wherein said magnetic material of said field forming device is substantially magnetically saturated, and a magnetization of said field forming device points substantially parallel or anti-parallel to the z axis.

15. The method of claim 14, used for homogenizing said outer coil means using said magnetically saturated magnetic field forming device magnetized parallel or anti-parallel to the z axis and which is cylindrically symmetrical with respect to the z axis, wherein said field forming device is disposed cylindrically symmetrically about the z axis and field in homogeneities $H_n(C2)$ of said outer coil means which vary along the z axis with the nth power of z, are compensated for n=1, 2, 3 and 4 through corresponding field inhomogeneities $H_n(P)=-H_n(C2)$ of said magnetic field forming device (P), wherein said field inhomogeneities $H_n(P)$ are calculated by assuming a cylindrical surface current $J_S$ on each radially inner and each radially outer surface $S=SI_k$ and $S=SA_m$ of said magnetic field forming device (P) with a contribution $H_n(S)$ to the field inhomogeneity $H_n(P)$ of $$H_n(S)\left[\frac{T}{m^n}\right] = \frac{\mu_0 \cdot J_S}{R_S^n}\left(Y_n\left(\frac{z1_S}{R_S}\right) - Y_n\left(\frac{z2_S}{R_S}\right)\right)$$

with

-continued $$J_S\left[\frac{A}{m}\right] = \begin{cases} -\text{sign}(M_z) \cdot \frac{M_{Sat}}{\mu_0} f\ddot{u}r S = SI_k \\ \text{sign}(M_z) \cdot \frac{M_{Sat}}{\mu_0} f\ddot{u}r S = SA_m \end{cases}$$

$$\mu_0 = 4\pi \cdot 10^{-7}\left[\frac{Vs}{Am}\right]$$

with these variables being defined as follows:
sign($M_z$): Sign of an axial magnetization of said magnetic material of said field forming device (P),
$M_{Sat}$[T]: Saturation magnetization of said magnetic material of said field forming device (P),
$R_S$[m]: Radius of said cylindrical surface S,
$z1_S$[m]: Distance of a lower edge of said cylindrical surface S from z=0,
$z2_S$[m]: Distance of an upper edge of said cylindrical surface S from z=0, $$Y_1(x) = \frac{1}{2(x^2+1)^{\frac{3}{2}}},$$

$$Y_2(x) = \frac{3x}{4(x^2+1)^{\frac{5}{2}}},$$

$$Y_3(x) = \frac{(4x^2-1)}{4(x^2+1)^{\frac{7}{2}}},$$

$$Y_4(x) = \frac{5x(4x^2-3)}{16(x^2+1)^{\frac{9}{2}}},$$

and by adding together the contributions $H_nu(S)$ of all surface currents $J_S$.

16. The method of claim 14, used for compensating residual in homogeneities in the field of the magnetic system, said field inhomogeneities having a quadratic z dependence along the z axis, the method comprising the step of varying a current in said inner coil means and a current in said outer coil means in a same suitable fashion.

17. The method of claim 14, used for compensating residual inhomogeneities in the field of the magnetic system, wherein said inner coil means and said outer call means are electrically separated to form a first and a second separate current oath, and further comprising a first superconducting switch bridging said first separate current oath and a second superconducting switch bridging said second separate current path, said field inhomogeneities having a quadratic z dependence along the z axis, the method comprising the step of suitably varying a current in said outer coil means and of varying a current in said inner coil means in a different manner to keep the field constant in the working volume at z=0.

18. The method of claim 14, used for calculating a field contribution $H_0(P)$, in the working volume at z=0, of said magnetically saturated magnetic field forming device, magnetized parallel or anti-parallel to the z axis and being cylindrically symmetrical with respect to the z axis of claim 2, wherein a cylindrical surface current $J_S$ is assumed on each radially inner and each radially outer surface $S=SI_k$ and $S=SA_m$ of said magnetic field forming device (P) whose contribution $H_0(S)$ to $H_0(P)$ is $$H_0(S)[T] = \mu_0 \cdot J_S \cdot \left(Y_0\left(\frac{z1_S}{R_S}\right) - Y_0\left(\frac{z2_S}{R_S}\right)\right) \text{ with}$$

$$J_S\left[\frac{A}{m}\right] = \begin{cases} -\text{sign}(M_z) \cdot \frac{M_{Sat}}{\mu_0} f\ddot{u}r S = SI_k \\ \text{sign}(M_z) \cdot \frac{M_{Sat}}{\mu_0} f\ddot{u}r S = SA_m \end{cases}$$

$$\mu_0 = 4\pi \cdot 10^{-7}\left[\frac{Vs}{Am}\right]$$

with these variables being defined as follows:
sign($M_z$): Sign of an axial magnetization of said magnetic material of said field forming device (P),
$M_{Sat}$[T]: Saturation magnetization of said magnetic material of said field forming device (P),
$R_S$[m]: Radius of said cylinder surface S,
$z1_S$[m]: Distance of a lower edge of said cylinder surface S from z=0,
$z2_S$[m]: Distance of an upper edge of said cylinder surface S from
z=0, $$Y_0(x) = -\frac{x}{2(x^2+1)^{\frac{1}{2}}},$$

wherein the contributions $H_0(S)$ of all surface currents $J_S$ are added.

19. The method of claim 14, used for calculating a magnetic dipole moment of said magnetically saturated magnetic field forming device (P) magnetized parallel or anti-parallel to the z axis and being cylindrically symmetrical with respect to the z axis, wherein said field forming device is disposed cylindrically symmetrically about the z axis, and a variable $$m(P)\left[\frac{A}{m^2}\right] = \frac{M_{Sat}}{\mu_0} \cdot V_P \cdot \text{sign}(M_z)$$

is calculated with $$\mu_0 = 4\pi \cdot 10^{-7}\left[\frac{Vs}{Am}\right]$$

with these variables being defined as follows:
sign($M_z$): Sign of an axial magnetization of said magnetic material of said field forming device (P),
$M_{Sat}$[T]: Saturation magnetization of said magnetic material of said field forming device (P),
$V_P$[m³]: Volume of said magnetic material of said field forming device (P).

* * * * *